United States Patent

Rijns

[11] Patent Number: 5,412,343
[45] Date of Patent: May 2, 1995

[54] COMMON-MODE SIGNAL SENSOR

[75] Inventor: Johannes J. F. Rijns, Eindhoven, Netherlands

[73] Assignee: U.S. Philips Corporation, New York, N.Y.

[21] Appl. No.: 69,885

[22] Filed: Jun. 1, 1993

[30] Foreign Application Priority Data

Jul. 30, 1992 [EP] European Pat. Off. ............ 92202351

[51] Int. Cl.6 .............................................. H03F 3/45
[52] U.S. Cl. ..................................... 330/253; 330/258
[58] Field of Search ........................ 330/252, 253, 258

[56] References Cited

U.S. PATENT DOCUMENTS 3,991,380 11/1976 Pryor ............................. 330/258 X
4,780,688 10/1988 Groom ............................. 330/261

OTHER PUBLICATIONS

"CMOS Voltage to Current Transducers", IEEE Transactions on Circuits and Systems, vol. CAS-32, No. 11, Nov. 1985, pp. 1097-1104.

*Primary Examiner*—James B. Mullins
*Attorney, Agent, or Firm*—Bernard Franzblau

[57] ABSTRACT

A common-mode signal sensor for supplying a common-mode signal in response to a difference signal. A first input terminal and a second input terminal receive the difference signal and an output terminal supplies the common-mode signal. A first differential pair of a first conductivity type is connected to a first current source at a first node and has its control electrodes connected to the input terminals. A second differential pair of a second conductivity type opposite to the first conductivity type is connected to a second current source at a second node and has its control electrodes also connected to the input terminals. A diode-connected fifth transistor of the first conductivity type is connected between the first node and the output terminal and a diode-connected sixth transistor of the second conductivity type is connected between the second node and the output terminal.

16 Claims, 2 Drawing Sheets

COMMON-MODE SIGNAL SENSOR

BACKGROUND OF THE INVENTION

The invention relates to a common-mode signal sensor for supplying a common-mode signal in response to a difference signal, comprising: a first input terminal and a second input terminal for receiving the difference signal, an output terminal for supplying the common-mode signal, a first and a second transistor, each having a first main electrode, a second main electrode and a control electrode, the first main electrodes of the first and the second transistor being interconnected in a first node and the control electrode of the first transistor being coupled to the first input terminal, a first current source coupled to the first node to supply a first bias current, a third and a fourth transistor, each having a first main electrode, a second main electrode and a control electrode, the first main electrodes of the third and the fourth transistor being interconnected in a second node and the control electrode of the fourth transistor being coupled to the second input terminal, and a second current source coupled to the second node to supply a second bias current.

Such a common-mode signal sensor is known from the article "CMOS Voltage to Current Transducers", IEEE Transactions on Circuits and Systems, Vol. CAS-32, No. 11, November 1985, pp. 1097–1104, FIG. 6. Common-mode signal sensors are used in common-mode rejection circuits for operational amplifiers, transconductors and similar electronic circuits. A known technique for measuring the common-mode signal content of a difference signal utilises the voltage on the node common to the first main electrodes of a standard differential pair whose control electrodes are arranged to receive the difference signal. This arrangement has the drawback that said voltage contains not only the common-mode signal but also the threshold voltage of the transistors which are used and, in addition, a part of the difference signal. The common-mode signal sensor known from said article employs two differential pairs. The first and the second transistor with the first current source constitute the first differential pair. The third and the fourth transistor with the second current source constitute the second differential pair. The control electrodes of the first and the fourth transistor are connected to the first and the second input terminal and receive the input signal whose common-mode voltage is to be measured. In a third node the control electrodes and the second main electrodes of the second and the third transistor are all connected to a third current source supplying a current equal to that of the first and the second current source. The voltage on the third node is a measure of the common-mode voltage of the input signal and no longer contains the threshold voltage of the transistors. However, this common-mode signal sensor has the drawback of a limited difference signal range because the voltages on the first and the second node do not increase symmetrically with an increasing difference voltage on the input terminals.

SUMMARY OF THE INVENTION

It is an object of the invention to provide a common-mode signal sensor having a large difference signal range. To this end a common-mode signal sensor of the type defined in the opening paragraph is characterised in that the first and the second transistor are of a first conductivity type, the third and the fourth transistor are of a second conductivity type opposite to the first conductivity type, the control electrode of the third transistor is coupled to the first input terminal, the control electrode of the second transistor is coupled to the second input terminal, and the common-mode signal sensor further comprises: a fifth transistor of the first conductivity type having a first main electrode, which is connected to the first node, and having a second main electrode and a control electrode, which are connected to the output terminal, and a sixth transistor of the second conductivity type having a first main electrode, which is connected to the second node, and having a second main electrode and a control electrode which are connected to the output terminal.

The differential pairs are of opposite conductivity types and are both connected to the input terminals. The fifth and the sixth transistor function as a voltage divider for the common-mode voltages on the first and the second node, the components therein caused by the threshold voltages of the differential pairs being cancelled by the threshold voltages of the fifth and the sixth transistor.

It is to be noted that FIG. 3 of U.S. Pat. No. 4,780,688 discloses a circuit which bears a resemblance to the common-mode signal sensor in accordance with the invention. However, in the circuit disclosed therein the second node is connected to the second current source and to the first main electrode of the sixth transistor via a resistor. Moreover, the output terminal is not connected to the node of the second main electrodes and the control electrodes of the fifth and the sixth transistor. As a matter of fact, this known circuit is not a common-mode signal sensor but a circuit for increasing the slew rate of the differential amplifier formed by the third and the fourth transistor.

BRIEF DESCRIPTION OF THE DRAWINGS

These an other aspects of the invention will now be described and illustrated with reference to the accompanying drawings, in which.

In these Figures pans having the same function or purpose bear the same references.

DESCRIPTION OF THE PREFERRED EMBODIMENTS

Figure 1:
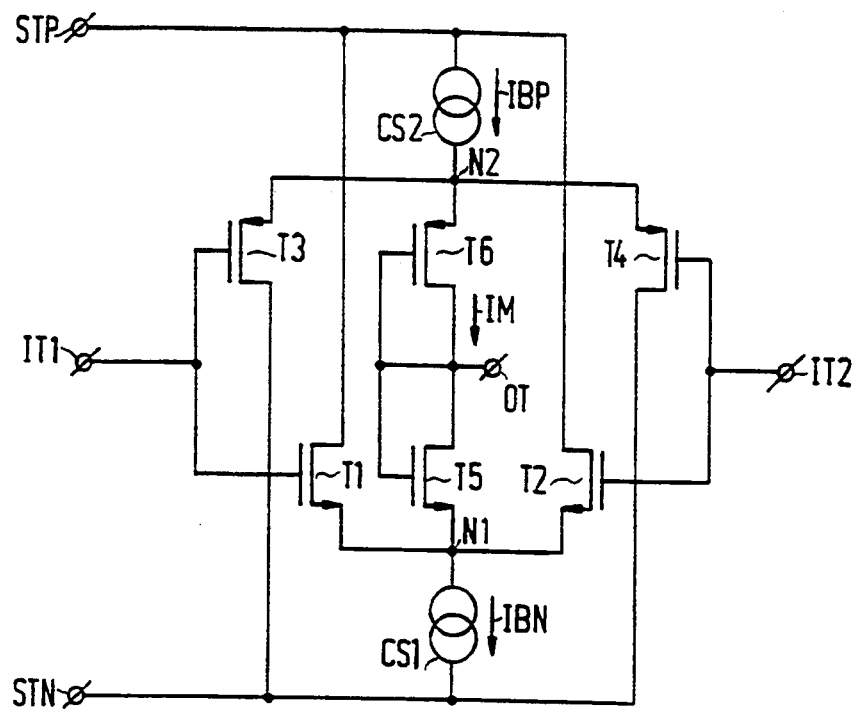
FIG. 1 shows a circuit diagram of a common-mode signal sensor in accordance with the invention in an embodiment comprising unipolar transistors.

FIG. 1 shows a common-mode signal sensor in accordance with the invention comprising unipolar transistors whose source, drain and gate correspond to the first main electrode, the second main electrode and the control electrode formed respectively. NMOS transistors T1 and T2 form a first differential pair. The transistors T1 and T2 have their source electrodes interconnected in a first node N1. The first node N1 is connected to a negative supply terminal STN via a first current source CS1 drawing a bias current IBN from the first node N1. The drains of the transistors T1 and T2 are connected, for example, directly to a positive supply terminal STP.

However, if desired, the drains may alternatively be connected to the positive supply terminal STP via a load, such as a resistor or an input branch of a current mirror. The gate of the transistor T1 is connected to a first input terminal IT1. The gate of the transistor T2 is connected to a second input terminal IT2. A second differential pair is formed by the PMOS transistors T3 and T4 having their sources interconnected in a second node N2. The second node N2 is connected to the positive supply terminal STP via a second current source CS2 supplying a bias current IBP to the second node N2. The gates of the transistors T3 and T4 are connected to the first input terminal IT1 and the second input terminal IT2, respectively. The drains of the transistors T3 and T4 are connected to the negative supply terminal STN, but may alternatively be connected to this terminal via a load. Moreover, the first node N1 is connected to the source of an NMOS transistor T5 having the same threshold voltage as the transistors T1 and T2. The gate and the drain of the transistor T5 are each connected to an output terminal OT. The second node N2 is further connected to the source of a PMOS transistor T6 having the same threshold voltage as the transistors T3 and T4 and having its gate and drain connected to the output terminal OT.

It is now assumed that a difference signal Vin is applied to the input terminals, the voltage Vi1 on the first input terminal IT1 and the voltage Vi2 on the second input terminal IT2 complying with:

$$Vi1 = Vcm + Vin/2 \tag{1}$$

$$Vi2 = Vcm + Vin/2 \tag{2}$$

In these equations Vcm is the common-mode component of the difference voltage Vin. In order to simplify the analysis it is further assumed that all of the transistors operate in the saturated mode so that the relationship between the drain current I and the gate-source voltage Vgs is defined by the equation:

$$I = K(Vgs - Vt)^2 \tag{3}$$

Here, Vt is the threshold voltage of the transistor and K is a transconductance parameter which depends, inter alia, on the width-length ratio (W/L) of the transistor. The NMOS differential pair T1, T2 supplies a difference current Ioutn, i.e. the difference between the drain currents of the transistors T1 and T2, which is a function of the difference voltage Vin. This function, expressed in terms of Gmn, becomes:

$$Ioutn = Gmn * Vin \tag{4}$$

It is further assumed that a current IM flows through the transistors T5 and T6, which current is not constant but depends on the instantaneous voltage difference Vin. This results in a current IBN−IM through the transistors T1 and T2 together. The current flowing through T1 is now equal to half the current IBN−IM and half the current Ioutn. In accordance with equation (3) the current through the transistor T1 then complies with:

$$(Gmn*Vin)/2 + (IBN - IM)/2 = Kn(Vgs1 - Vtn)^2 \tag{5}$$

Here, Vgs1 is the gate-source voltage of the transistor T1, Kn is the transconductance parameter, and Vtn is the threshold voltage of the NMOS transistors. The voltage VN1 on the first node N1 is equal to:

$$NV1 = Vi1 - Vgs1 \tag{6}$$

Elimination of Vgs1 from equation (5), substitution of Vi1 by the fight-hand member of equation (1), and insertion into equation (6) yield:

$$Vn1 = Vcm + Vin/2 - Vtn\text{-}SQRT\{[(IBN{-}IM) + Gmn*Vin]/2Kn\} \tag{7}$$

The output terminal OT carries a voltage VOT which is the sum of the gate-source voltage Vgs5 of the transistor T5 and the voltage VN1 on the first node N1:

$$VOT = VN1 + Vgs5 \tag{8}$$

Since the current through the transistor T5 is equal to IM, equation (8) may be rewritten by means of equation (3) to give:

$$VOT - VN1 = Vtn + SQRT\{IM/Kn\} \tag{9}$$

In an entirely similar way the following equations can be found for the differential pair T3, T4 and the associated transistor TG:

$$VN2 = Vcm - Vin/2 + Vtp + SQRT\{](IBP{-}IM) + Gmp*Vin]/2Kp\} \tag{10}$$

$$VN2 - VOT = Vtp + SQRT\{IM/Kp\} \tag{11}$$

where Vtp, Gmp and Kp of the PMOS transistors T4, T3 and T6 take the place of Vtn, Gmn and Kn of the NMOS transistors T1, T2 and TS. By choosing Kp=Kn it follows from equations (9) and (11) that:

$$2VOT = (VN1 + VN2) + (Vtn - Vtp) \tag{12}$$

As a result of the choice IBN=IBP the difference currents Ioutn and Ioutp become equal to each other, so that Gmn * Vin and Gmp * Vin also become equal to each other. As a consequence, the terms SQRT in equations (7) and (10) are equal to each other. Addition of equations (7) and (10) then yields:

$$VN1 + VN2 = 2Vcm + (Vtp - Vtn) \tag{13}$$

Combining equations (12) and (13) results in VOT=Vcm. This means that the voltage on the output terminal OT is equal to the common-mode voltage on the input terminals IT1 and IT2 for any value of Vin.

The transconductance parameters Kn and Kp can be equalised by an appropriate choice of the W/L ratio of the NMOS transistors and of the W/L ratio of the PMOS transistors. The common-mode signal sensor even functions in the case of non-compliance with Kp=Kn and/or IBN=IBP. The output voltage VOT will then exhibit a certain fluctuation as a function of Vin.

Figure 2:
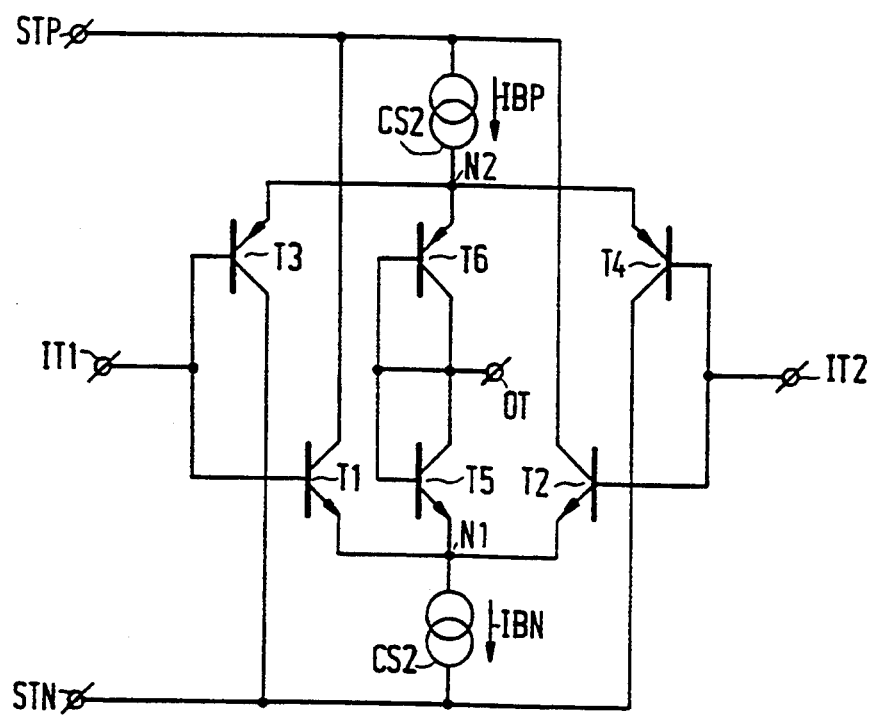
FIG. 2 shows a circuit diagram of a common-mode signal sensor in accordance with the invention in an embodiment comprising bipolar transistors.

FIG. 2 shows a common-mode signal sensor comprising bipolar transistors whose emitter, collector and base correspond respectively to the first main electrode, the second main electrode and the control electrode. The PMOS transistors have been replaced by PNP transistors and the NMOS transistors by NPN transistors. However, the relationship between the current through the transistor and the base-emitter voltage is not as defined by equation (3) but eventually the result is the same. It is to be noted that instead of the requirement Kn=Kp other parameters should be equal to each other for bipolar transistors. In this case the requirements $\beta p = \beta n$ and Isp=Isn should be met, where $\beta$ is the current gain factor and Is is the saturation current of the bipolar transistor.

Figure 3:
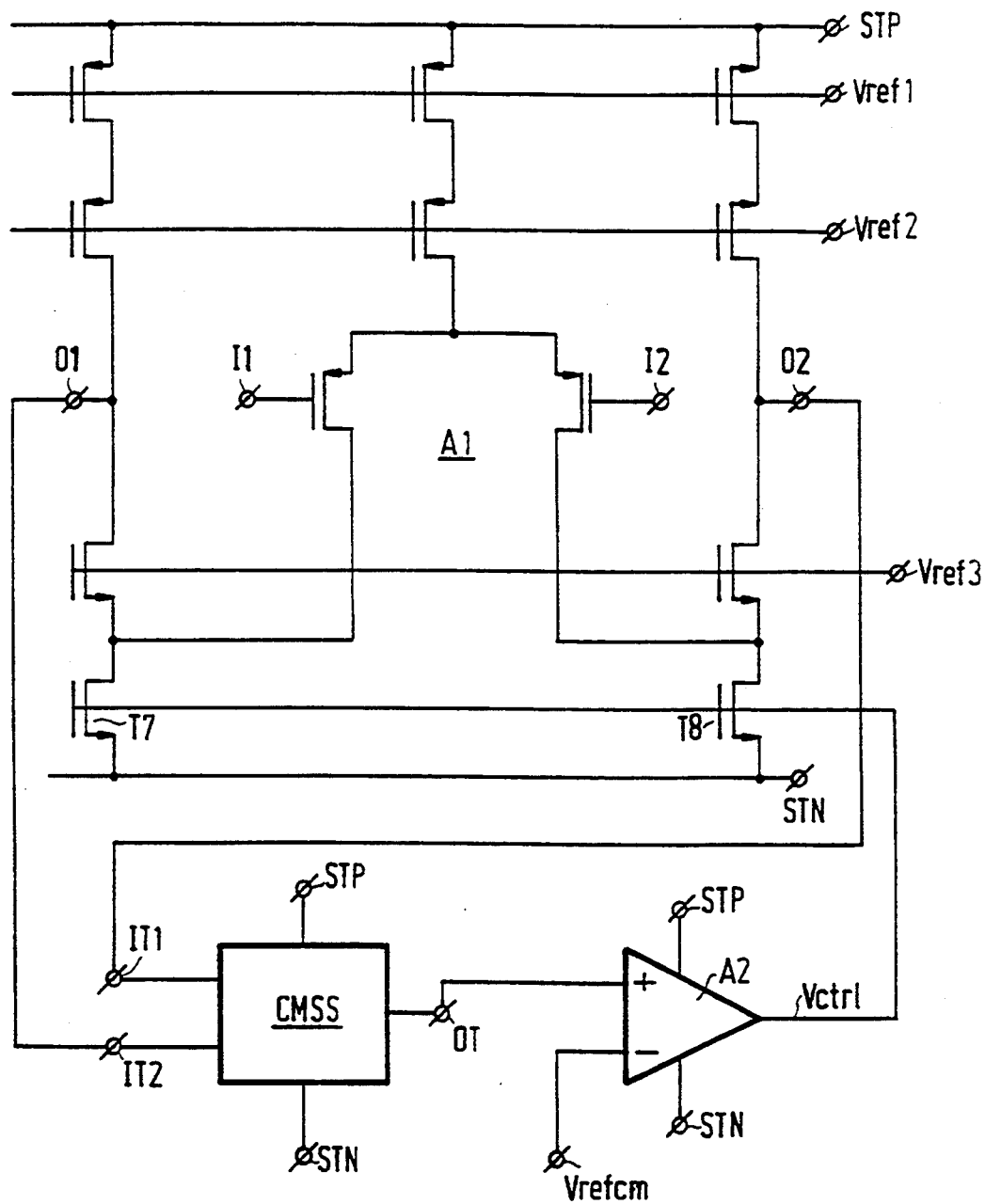
FIG. 3 shows a circuit diagram of an operational amplifier comprising a common-mode rejection circuit using a common-mode signal sensor in accordance with the invention.

FIG. 3 shows a use of a common-mode signal sensor in accordance with the invention. The common-mode signal sensor is referenced CMSS and its internal circuit is as shown in FIG. 1. The input terminals IT1 and IT2 are respectively connected to the output terminals O2 and O1 of an amplifier A1. The common-mode voltage on the output terminal OT is compared with a common-mode reference voltage Vrefcm in an amplifier A2 to supply a control voltage Vctrl to the transistors T7 and T8 of the amplifier A1, which transistors are each arranged as a controllable current source. In this way the common-mode voltage on the outputs 01 and 02 is controlled towards the desired reference voltage Vrefcm.

I claim:

1. A common-mode signal sensor for supplying a common-mode signal in response to a difference signal, comprising: first and second supply terminals, a first input terminal and a second input terminal for receiving the difference signal, an output terminal for supplying the common-mode signal, a first and a second transistor, each having a first main electrode, a second main electrode and a control electrode, the first main electrodes of the first and the second transistor being interconnected at a first node, the second main electrodes thereof being directly connected to the first supply terminal and the control electrode of the first transistor being coupled to the first input terminal, a first current source coupled to the first node to supply a first bias current (IBN), a third and a fourth transistor, each having a first main electrode, a second main electrode and a control electrode, the first main electrodes of the third and the fourth transistor being interconnected at a second node, the second main electrodes thereof being coupled to the second supply terminal and the control electrode of the fourth transistor being coupled to the second input terminal, and a second current source coupled to the second node to supply a second bias current (IBP), characterised in that the first and the second transistor are of a first conductivity type, the third and the fourth transistor are of a second conductivity type opposite to the first conductivity type, the control electrode of the third transistor is coupled to the first input terminal, the control electrode of the second transistor is coupled to the second input terminal, a fifth transistor of the first conductivity type having a first main electrode connected to the first node and having a second main electrode and a control electrode connected to the output terminal, and a sixth transistor of the second conductivity type having a first main electrode connected to the second node and having a second main electrode and a control electrode connected to the output terminal.

2. A common-mode signal sensor as claimed in claim 1, wherein the first, the second and the fifth transistor are substantially identical to one another, and the third, the fourth and the sixth transistor axe substantially identical to one another.

3. A common-mode signal sensor as claimed in claim 2, wherein the first bias current is substantially equal to the second bias current.

4. A common-mode signal sensor as claimed in claim 3, wherein by an appropriate choice of transistor parameters defining the proportionality factor between a current variation in the main current path of the transistor and a voltage variation between the control electrode and the first main electrode of the transistor, the proportionality factor is substantially the same for the first to the sixth transistor.

5. A common-mode signal sensor as claimed in claim 2, wherein by an appropriate choice of transistor parameters defining the proportionality factor between a current variation in the main current path of the transistor and a voltage variation between the control electrode and the first main electrode of the transistor, the proportionality factor is substantially the same for the first to the sixth transistor.

6. A common-mode signal sensor as claimed in claim 1, wherein the first bias current is substantially equal to the second bias current.

7. A common-mode signal sensor for supplying a common-mode signal in response to a difference signal, comprising: first and second supply terminals, a first input terminal and a second input terminal for receiving the difference signal, an output terminal for supplying the common-mode signal, a first and a second transistor, each having a first main electrode, a second main electrode and a control electrode, the first main electrodes of the first and the second transistor being interconnected at a first node, the second main electrodes thereof being coupled to the first supply terminal and the control electrode of the first transistor being coupled to the first input terminal, a first current source coupled to the first node to supply a first bias current (IBN), a third and a fourth transistor, each having a first main electrode, a second main electrode and a control electrode, the first main electrodes of the third and the fourth transistor being interconnected at a second node, the second main electrodes thereof being coupled to the second supply terminal and the control electrode of the fourth transistor being coupled to the second input terminal, and a second current source coupled to the second node to supply a second bias current (IBP), characterised in that the first and the second transistor are of a first conductivity type, the third and the fourth transistor are of a second conductivity type opposite to the first conductivity type, the control electrode of the third transistor is coupled to the first input terminal, the control electrode of the second transistor is coupled to the second input terminal, a fifth transistor of the first conductivity type having a first main electrode connected to the first node and having a second main electrode and a control electrode connected to the output terminal, a sixth transistor of the second conductivity type having a first main electrode connected to the second node and having a second main electrode and a control electrode connected to the output terminal, and said first and second current sources supply first and second bias currents, respectively, that are independent of said difference signal.

8. A common-mode signal sensor circuit comprising:
first and second input terminals for receipt of a difference signal having a common-mode signal component,
an output terminal for supplying the common-mode signal,
a first differential pair including first and second transistors of a first conductivity type each having first and second main electrodes and a control electrode, a second differential pair including third and fourth transistors of a second conductivity type opposite to the first conductivity type and each having first and second main electrodes and a control electrode, a fifth diode-connected transistor of the first conductivity type, a sixth diode-connected transistor of the second conductivity type, first and second supply voltage terminals, first and second bias current sources which supply first and second bias currents, respectively, which are independent of the difference signal at the input terminals, first means coupling said first current source, said fifth transistor, said sixth transistor and said second current source in series between said first and second supply voltage terminals so as to form a first node between the first current source and the fifth transistor and a second node between the sixth transistor and the second current source, first means connecting the first main electrodes of the first and second transistors to the first node, second means connecting the first main electrodes of the third and fourth transistors to the second node, second means coupling the control electrodes of the first and third transistors to the first input terminal and the control electrodes of the second and fourth transistors to the second input terminal, third means coupling the second main electrodes of the first, second, third and fourth transistors to respective ones of the first and second supply voltage terminals, and third means connecting the output terminal to a junction between the fifth and sixth transistors.

9. The common-mode signal sensor circuit as claimed in claim 8 wherein the third coupling means couples said second main electrodes such that the second main electrodes of the first and second transistors are decoupled from the second main electrodes of the third and fourth transistors.

10. The common-mode signal sensor circuit as claimed in claim 8 wherein the third coupling means couples said second main electrodes to the first and second supply voltage terminals such that the second main electrodes of the first, second, third and fourth transistors are decoupled from said output terminal.

11. The common-mode signal sensor circuit as claimed in claim 8 wherein said first and second transistors are each connected in a respective series circuit with said first current source between the supply voltage terminals so that each respective series circuit bypasses the second current source and said third and fourth transistors are each connected in a respective further series circuit with said second current source between the supply voltage terminals so that each respective further series circuit bypasses the first current source.

12. The common-mode signal sensor circuit as claimed in claim 8 wherein said third coupling means couples the second main electrodes of the first and second transistors to the first supply voltage terminal and the second main electrodes of the third and fourth transistors to the second supply voltage terminal.

13. The common-mode signal sensor circuit as claimed in claim 8 wherein the first bias current is equal to the second bias current.

14. The common-mode signal sensor circuit as claimed in claim 8 wherein the fifth and sixth transistors are connected between said first and second nodes and the first, second, third and fourth transistors are connected in first, second, third and fourth series circuits respectively, between the first and second supply voltage terminals, said first and second series circuits bypassing the second node and the third and fourth series circuits bypassing the first node.

15. The common-mode signal sensor circuit as claimed in claim 8 wherein said output terminal comprises the only output terminal of the circuit.

16. The common-mode signal sensor circuit as claimed in claim 8 wherein said third coupling means connects each of said first and second transistors between said first node and said first supply voltage terminal such that said first bias current flows through the first and second transistors and bypasses the third and fourth transistors, and said third coupling means connects each of said third and fourth transistors between said second node and said second supply voltage terminal such that said second bias current flows through the third and fourth transistors and bypasses the first and second transistors.

* * * * *